US012593695B2

(12) United States Patent
Yeon et al.

(10) Patent No.: US 12,593,695 B2
(45) Date of Patent: Mar. 31, 2026

(54) STRUCTURE AND PROCESS FOR WARPAGE REDUCTION

(71) Applicant: Intel Corporation, Santa Clara, CA (US)

(72) Inventors: Hong Seung Yeon, Chandler, AZ (US); Liang He, Chandler, AZ (US); Whitney Bryks, Tempe, AZ (US); Jung Kyu Han, Chandler, AZ (US); Gang Duan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 608 days.

(21) Appl. No.: 18/060,574

(22) Filed: Dec. 1, 2022

(65) Prior Publication Data

US 2024/0186263 A1     Jun. 6, 2024

(51) Int. Cl.
*H01L 23/00*          (2006.01)

(52) U.S. Cl.
CPC ............. *H01L 23/562* (2013.01); *H01L 24/13* (2013.01); *H01L 2224/32225* (2013.01); *H01L 2924/3511* (2013.01)

(58) Field of Classification Search
CPC .................................................... H01L 23/562
See application file for complete search history.

(56) References Cited

U.S. PATENT DOCUMENTS

| | | | | |
|---|---|---|---|---|
| 6,229,216 | B1 * | 5/2001 | Ma | H01L 23/49827 |
| | | | | 257/722 |
| 9,613,931 | B2 * | 4/2017 | Lin | H01L 25/0652 |
| 12,113,022 | B2 * | 10/2024 | Tseng | H01L 23/5385 |
| 2007/0216004 | A1 * | 9/2007 | Brunnbauer | H01L 23/544 |
| | | | | 257/E23.178 |
| 2010/0248427 | A1 * | 9/2010 | Wu | H10D 62/117 |
| | | | | 438/126 |
| 2010/0320576 | A1 * | 12/2010 | Hu | H01L 23/562 |
| | | | | 438/758 |
| 2011/0215470 | A1 * | 9/2011 | Chen | H01L 25/0655 |
| | | | | 257/773 |
| 2014/0217599 | A1 * | 8/2014 | Teh | H01L 23/49822 |
| | | | | 438/126 |
| 2015/0028498 | A1 * | 1/2015 | Ji | C08L 63/04 |
| | | | | 524/424 |
| 2015/0061162 | A1 * | 3/2015 | Yu | H01L 24/19 |
| | | | | 438/107 |
| 2016/0322330 | A1 * | 11/2016 | Lin | H01L 25/0652 |
| 2018/0102313 | A1 * | 4/2018 | Shih | H01L 25/0655 |
| 2019/0287924 | A1 * | 9/2019 | Moon | H01L 23/5384 |
| 2022/0148996 | A1 * | 5/2022 | Tsai | H01L 21/6835 |
| 2025/0054821 | A1 * | 2/2025 | Li | H01L 24/19 |

* cited by examiner

*Primary Examiner* — William A Harriston
(74) *Attorney, Agent, or Firm* — VIERING, JENTSCHURA & PARTNER mbB

(57)          ABSTRACT

The present disclosure is directed to a semiconductor carrier platform having a support panel with a top surface and a bottom surface, with the top surface providing a working surface for assembling IC packages using panel-level packaging technology. In an aspect, a backside molding layer may be positioned on the bottom surface of the support panel to prevent or correct any panel warpage. In another aspect, a removable film may be positioned between the bottom surface of the support panel and the backside molding layer to allow the support panel to be readily cleaned and reused.

20 Claims, 4 Drawing Sheets

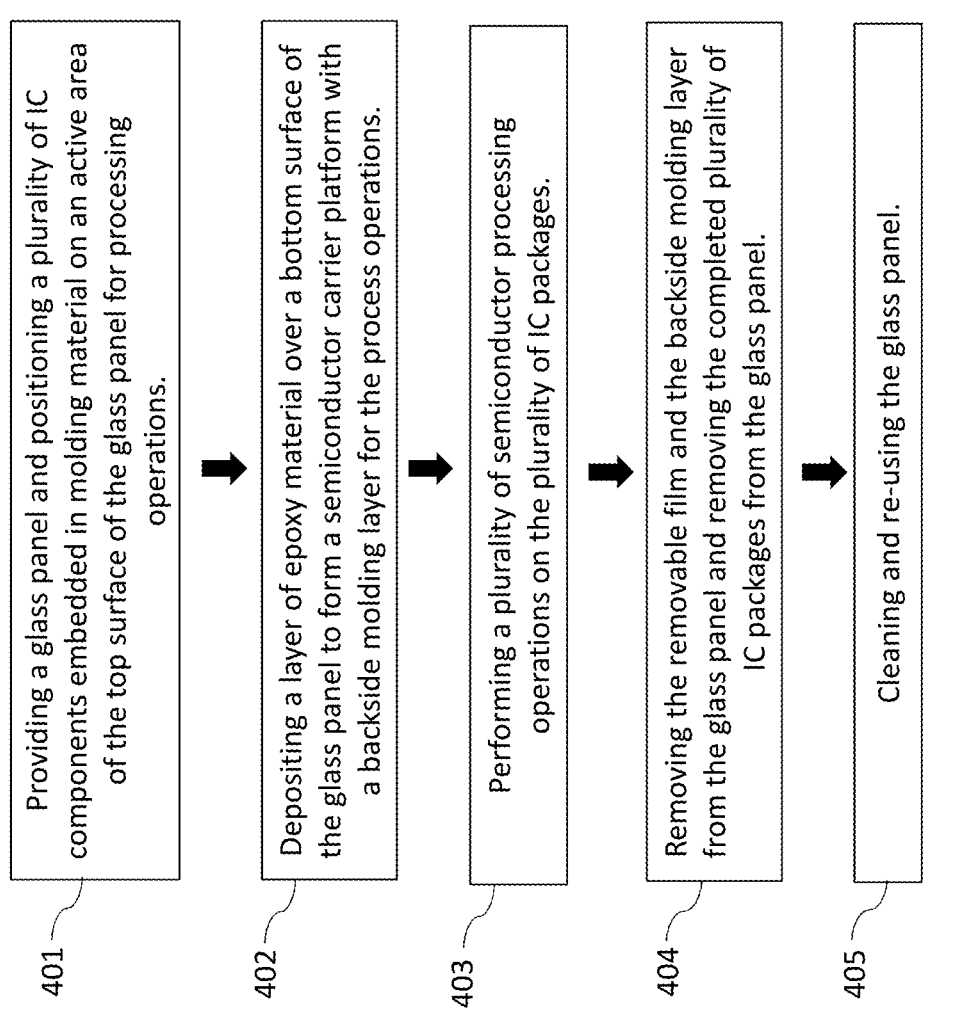

401 — Providing a glass panel and positioning a plurality of IC components embedded in molding material on an active area of the top surface of the glass panel for processing operations.

402 — Depositing a layer of epoxy material over a bottom surface of the glass panel to form a semiconductor carrier platform with a backside molding layer for the process operations.

403 — Performing a plurality of semiconductor processing operations on the plurality of IC packages.

404 — Removing the removable film and the backside molding layer from the glass panel and removing the completed plurality of IC packages from the glass panel.

405 — Cleaning and re-using the glass panel.

FIG. 4

STRUCTURE AND PROCESS FOR WARPAGE REDUCTION

BACKGROUND

For integrated circuit design and fabrication, the need to improve performance and lower costs are constant challenges. The continuing trend towards miniaturization, i.e., a reduction in the form factor for a printed circuit board with a semiconductor package and various other components, may lead to lower material costs, as well as improved performance with more compact designs. Further cost savings may potentially be realized by building dies on semiconductor panels rather than semiconductor wafers.

By using a rectangular panel as a carrier, panel-level fan-out technology, which uses a molded embedded design, offers the potential for lower production cost due to a higher area utilization ratio of the carrier and better economical manufacturing, especially for large packages. Presently, there are efforts to develop panel-level packaging technology that will follow a roadmap that will lead to increasingly larger panels, e.g., 610 mm by 457 mm panels and larger. However, there may be physical limits in panel-level packaging that may prevent the use of larger panels, such as warpage.

The panel warpage may be due to several factors, including the shrinkage of the epoxy molding compound during the post-curing stage, process-induced stresses, and the mismatch in the coefficients of thermal expansion (CTE) of the individual encapsulation materials and the carrier. Additionally, in the production and application of this technology, panel warpage may result in various technical issues, e.g., the panel-level warpage may exceed the handling capability of processing tools, rendering processing operations extremely difficult to align and resulting in low yields. Therefore, it is critically important to prevent or reduce the panel warpage during manufacturing and assembly processes for panel-level packaging.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 4 shows a simplified flow diagram for an exemplary method according to an aspect of the present disclosure.

DETAILED DESCRIPTION

Figure 1:
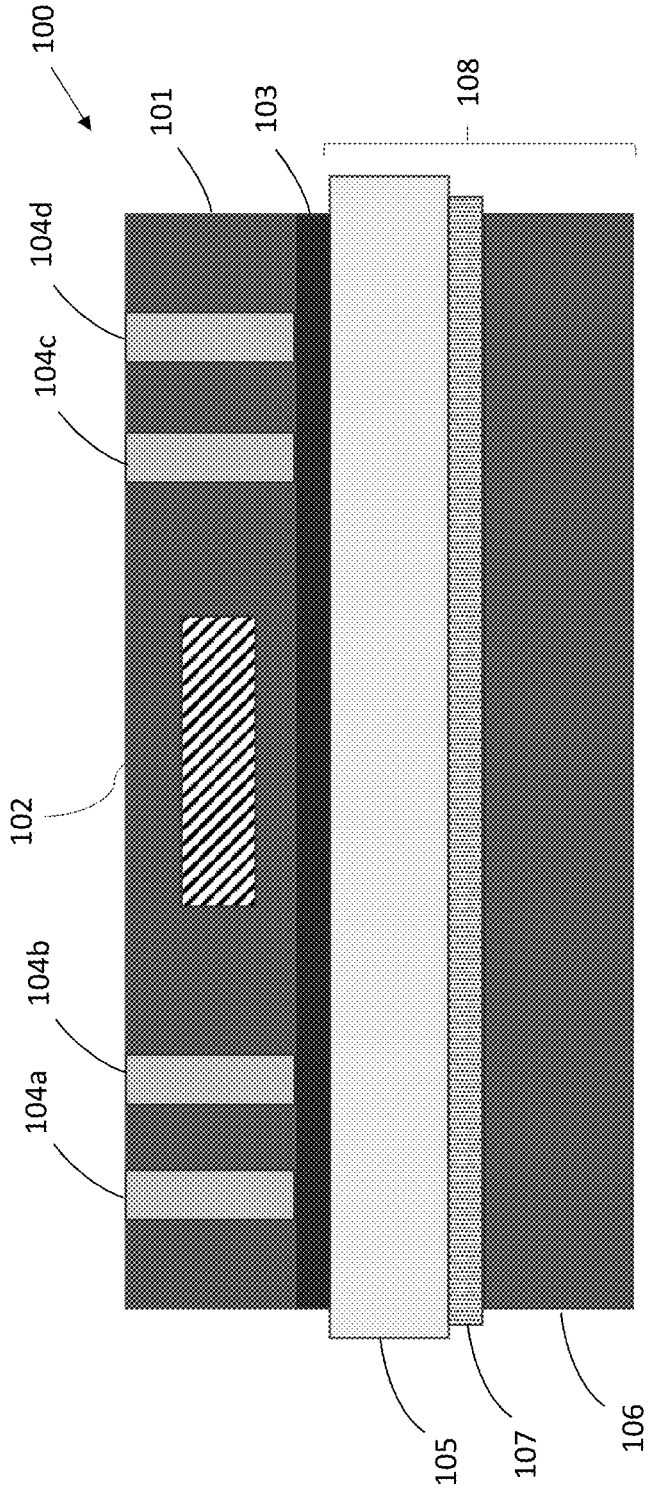
FIG. 1 shows an exemplary cross-section view of a semiconductor carrier platform with a semiconductor package according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to a semiconductor carrier platform having a support panel with a top surface and a bottom surface, with the top surface providing an active or working surface for assembling IC packages. In an aspect, a backside molding layer may be positioned on the bottom surface of the support panel. In another aspect, a removable film may be positioned between the bottom surface of the support panel and the backside molding layer.

In another aspect, the present disclosure is directed to a method that provides a support panel having top and bottom surfaces, with the top surface providing an active area for the placement and assembly of IC packages, and also placing a removable film on the bottom surface of the support panel. The method further provides a depositing of an epoxy material on the removable film to form a semiconductor carrier platform, with the epoxy material (i.e., backside molding layer) providing warpage reduction/prevention for the semiconductor carrier platform.

In yet another aspect, the present disclosure is directed to a method providing a support panel with top and bottom surfaces, positioning a plurality of IC packages on an active or working area of the top surface of the support panel, depositing an epoxy material over the bottom surface, which provides a backside molding layer for the support panel, and performing semiconductor processing operations on the plurality of IC packages, for which the support panel and the backside molding layer provide a semiconductor carrier platform for IC packages during the semiconductor processing operations.

The technical advantages of the present disclosure include, but are not limited to:

(i) Improved warpage control by a backside molding layer providing added structural support and an appropriate coefficient of thermal expansion to prevent panel warpage;

(ii) Ability to correct panel warpage that may be pre-existing in a panel or that may have been stress-induced during earlier operations; and (iii) Improved throughput of panel production lines by reducing the panel handling requirements of the processing tools.

To more readily understand and put into practical effect the present semiconductor carrier platform, including methods for making it, which may be used for panel-level manufacturing to improve their performance, particular aspects will now be described by way of examples provided in the drawings that are not intended as limitations. It should be understood that semiconductor carrier platform may be a wafer and the method applied to wafer warpage control. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, an exemplary cross-section view of a portion of a semiconductor carrier platform 108 with a semiconductor or integrated circuit (IC) package 100 is shown, according to an aspect of the present disclosure. In this aspect, the semiconductor package 100 may have a mold material 101 with an embedded semiconductor device 102 and a plurality of vertical interconnect vias 104a, 104b, 104c, and 104d. The semiconductor package 100 may be attached to the semiconductor carrier platform 108 by an adhesive layer 103. In an aspect, the adhesive layer 103 may be selected from a variety of conventional adhesive-based (or polymer-based) temporary bonding materials, which must be able to tolerate whatever process steps the semiconductor package 100 will undergo during its fabrication and may be formed by a conventional method, such as spin coating.

It should be understood that the present semiconductor package 100 may include a variety of different semiconductor devices; for example, a central processing unit (CPU), a graphics processing unit, chiplets, system-on-chips, etc. In addition, the semiconductor package 100 may also include a variety of interconnects; for example, copper metal interconnects that may form redistribution layers, plated through hole vias, etc.

In another aspect, the semiconductor carrier platform 108 may have a support panel 105, which may be a glass panel or other organic panel material, and a molded layer 106 that is positioned onto the support panel 105 over a thin adhesive removable tape or film 107, which may be used to assist in the removal of the molded layer 106. For example, the thin film 107 may be made of a heat-cured epoxy adhesive film or a polyimide photo-definable adhesive film which must be able to tolerate whatever process steps the semiconductor package 100 will undergo during its fabrication.

In an aspect, the support panel 105 may have a square or rectangular shape and, for example, have a size of 500×500 mm or greater. The molded layer 106 may act as a removable thermal stability layer and have a selected coefficient of thermal expansion (CTE) that is approximately the same or compatible with the CTE for the semiconductor package 100, i.e., the backside molding layer has a coefficient of thermal expansion that is selected based on a coefficient of thermal expansion for the IC packages to avoid or control panel warpage.

In a further aspect, the molded or backside molding layer 106 may be provided with a flat surface by a standard process, such as chemical mechanical planarization or polishing (CMP). The planarization step may be necessary if the panel warpage before the addition of a backside molding layer is significant and not adequately leveled by the formation of the backside molding layer. By providing a flat semiconductor carrier platform, the precision/alignment of the downstream operations on the semiconductor packages attached to the semiconductor carrier platform may be improved by having a level position on a stage of an operational tool.

Figure 2:
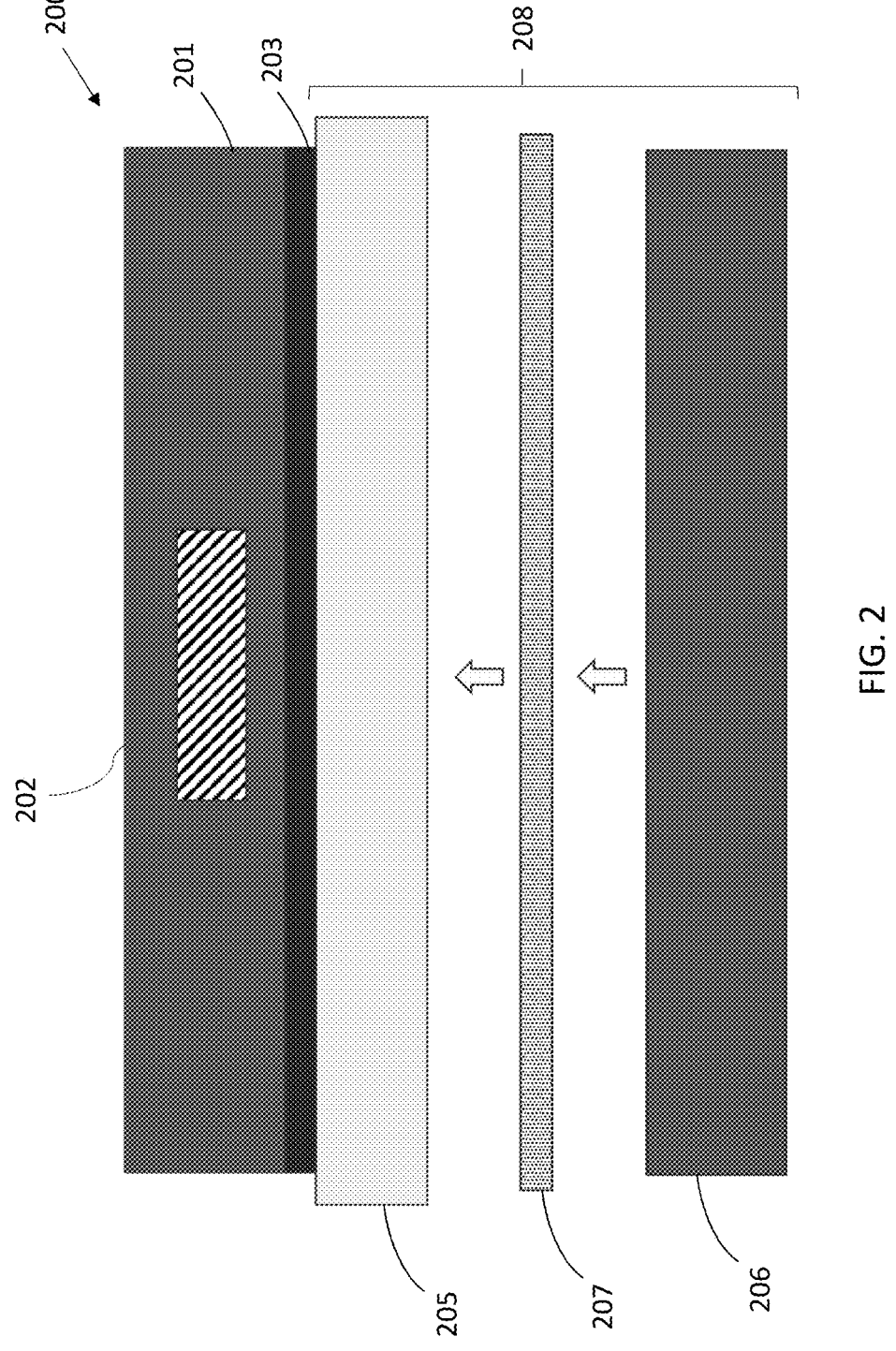
FIG. 2 shows an exemplary assembly of a semiconductor carrier platform according to an aspect of the present disclosure.

In FIG. 2, according to an aspect of the present disclosure, an exemplary assembly of a semiconductor carrier platform 208 is shown. A glass or organic panel 205 may be provided with a semiconductor or IC package 200, which is partially fabricated with a chiplet 202 embedded in a mold material 201. The semiconductor package 200 is first attached to a top surface of the glass or organic panel 205 by an adhesive layer 203. Thereafter, a removable thin film 207 may be attached to a bottom surface of the glass or organic panel

205, followed by the depositing or attachment of a molded or backside molding layer 206. A semiconductor carrier platform 208 is principally formed by the glass or organic panel 205 and backside molding layer 206, which are separated by the thin film 207.

In an aspect, the mold material 201 and the backside molding layer 206 may be made of the same epoxy material or similar materials. The materials used for encapsulating/embedding semiconductor devices are commonly known as plastic molding compounds. Molding compounds are generally composite materials consisting of epoxy resins, phenolic hardeners, silicas, catalysts, pigments, and mold release agents. According to the present disclosure, the important properties to consider when selecting a molding compound include its glass transition temperature, moisture absorption rate, flexural modulus/strength, thermal conductivity, adhesion properties, and in particular, coefficient of thermal expansion.

In yet another aspect, the thin film 207 may be provided by a conventional method, such as a spin coating method or as a sheet from a film roll. The molded or backside molding layer 206 may be formed by a conventional deposition method, such as lamination, a spray coating, a slit coating, a spin coating, or a molding method. The thickness of the backside molding layer 206 may be selected based on the thickness of the semiconductor package 200, i.e., the backside molding layer 206 may act to provide "balance" to the thermal stresses on the semiconductor package 200 through the use of a molding material with an appropriate coefficient of thermal expansion, e.g., the same, or otherwise matching.

Figure 3:
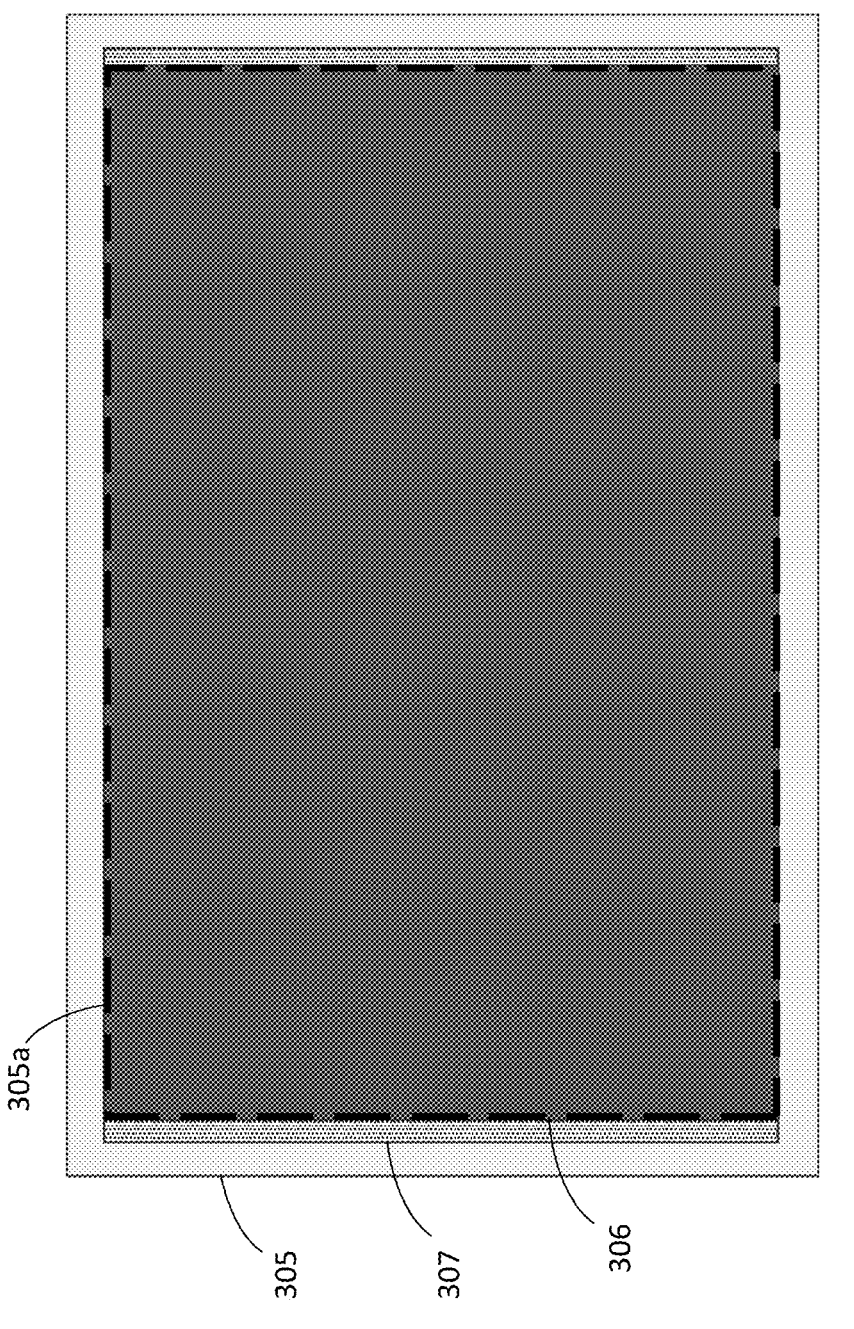
FIG. 3 shows an exemplary bottom view of a semiconductor carrier platform according to an aspect of the present disclosure.

In FIG. 3, an exemplary bottom view of a semiconductor carrier platform 308 is shown, according to an aspect of the present disclosure. The semiconductor carrier platform 308 may have a support panel 305, which may be a glass or organic panel, with an active area 305a for placing semiconductor packages on its top surface. The glass or organic panel 305 may have a removable thin film 307 and a molded backside molding layer 306 positioned on its bottom surface. In an aspect, the backside molding layer 306 may cover the active area 305a of the glass or organic panel 305.

In another aspect, as shown in FIG. 3, the removable thin film 307 may have an exposed portion that extends beyond the edge of the backside molding layer 306 that may provide an interface that allows for a "peeling off" of the backside molding layer 306.

In another aspect, while a specific choice for an adhesive used in the present disclosure may depend on the debonding method to be used, there are typically four conventional approaches—mechanical, chemical, thermal, and laser debonding.

For mechanical debonding, physical removal by polishing, plasma etch, grinding and other similar processes may be performed, and the adhesive rust be strong enough to survive subsequent process steps without slippage or delamination, but weak enough to allow easy separation from the carrier when desired.

For chemical debonding, an appropriate solvent (e.g. acid/base) dissolves the adhesive, floating the attached item or panel free from the carrier. This method may be slow for large panels, as the solvent can only reach the adhesive from the edges of the panel.

For thermal debonding, a thermal source heats the adhesive until it softens enough for the attached item to slide off. This method is fast, simple, and inexpensive, but only suitable for packaging schemes with modest temperature requirements.

For laser debonding, a laser light may be directed through a transparent carrier that decomposes the adhesive/bonding material, causing the bond to fail. Laser debonding may be attractive in part because of its digital character, i.e., the adhesive is permanent until the laser decomposes it completely.

FIG. 4 shows a simplified flow diagram for an exemplary method according to an aspect of the present disclosure. In an aspect, the present method may be able to provide backside molding layers as part of semiconductor carrier platforms.

The operation 401 may be directed to providing a glass panel and positioning a plurality of IC components embedded in molding material on an active area of the top surface of the glass panel for processing operations.

The operation 402 may be directed to depositing a layer of epoxy material over the bottom surface of the glass panel to form a semiconductor carrier platform with a backside molding layer for the process operations. A removable thin film may also be placed between the glass panel and the layer of epoxy material to facilitate the removal of the backside molding layer.

The operation 403 may be directed to performing a plurality of semiconductor processing operations on the plurality of IC packages.

The operation 404 may be directed to removing the removable film and the backside molding layer from the glass panel and removing the completed plurality of IC packages from the glass panel.

The operation 405 may be directed to cleaning and re-using the glass panel.

It will be understood that any property described herein for a specific semiconductor carrier platform may also hold for any panel-level carrier described herein. It will also be understood that any property described herein for a specific method may hold for any of the methods described herein. Furthermore, it will be understood that for any semiconductor carrier platform and the methods described herein, not necessarily all the components or operations described will be shown in the accompanying drawings or method, but only some (not all) components or operations may be disclosed.

To more readily understand and put into practical effect the present semiconductor carrier platforms and backside molding layers, they will now be described by way of examples. For the sake of brevity, duplicate descriptions of features and properties may be omitted.

EXAMPLES

Example 1 provides a semiconductor carrier platform including a support panel with a top surface and a bottom surface, for which the top surface provides a working surface for IC packages, and a backside molding layer, where the backside molding layer is positioned on the bottom surface of the support panel and has a coefficient of thermal expansion that is selected based on a coefficient of thermal expansion for the IC packages to enable warpage control.

Example 2 may include the semiconductor carrier platform of example 1 and/or any other example disclosed herein, which further includes a removable film positioned between the bottom surface of the support panel and the backside molding layer.

Example 3 may include the semiconductor carrier platform of example 1 and/or any other example disclosed herein, for which the backside molding layer further comprises an epoxy material.

Example 4 may include the semiconductor carrier platform of example 1 and/or any other example disclosed herein, for which the backside molding layer further comprises a molded material that is the same or similar to a mold material used in the IC packages.

Example 5 may include the semiconductor carrier platform of example 1 and/or any other example disclosed herein, for which the support panel further comprises the backside molding layer being sized to be at least co-extensive with the active area of the support panel.

Example 6 provides a method that provides a support panel with top and bottom surfaces, and the top surface provides an active area for the assembly of IC packages, then placing a removable film on the bottom surface of the support panel, and depositing an epoxy material on the removable film to form a semiconductor carrier platform, for which the epoxy material provides a backside molding layer for the semiconductor carrier platform that enables warpage control.

Example 7 may include the method of example 6 and/or any other example disclosed herein, for which the deposition of the epoxy material further comprises using a lamination, spray coating, slit coating, spin coating, or molding process.

Example 8 may include the method of example 6 and/or any other example disclosed herein, which further includes providing the backside molding layer with a level working surface.

Example 9 may include the method of example 6 and/or any other example disclosed herein, for which the level working surface for the backside molding layer is provided by chemical-mechanical polishing.

Example 10 may include the method of example 6 and/or any other example disclosed herein, for which the backside molding layer has a thickness that is selected based on a thickness of the IC packages.

Example 11 may include the method of example 6 and/or any other example disclosed herein, for which the backside molding layer enables warpage control by having a coefficient of thermal expansion that is selected based on a coefficient of thermal expansion for the IC packages.

Example 12 provides a method that provides a support panel with top and bottom surfaces, providing a plurality of IC packages on an active area of the top surface of the support panel, depositing an epoxy material over the bottom surface, for which the epoxy material provides a backside molding layer for the support panel, and performing semiconductor processing operations on the plurality of IC packages, for which the support panel and the backside molding layer provide a semiconductor carrier platform for IC packages during the semiconductor processing operations, wherein the backside molding layer has a coefficient of thermal expansion that is selected based on a coefficient of thermal expansion for the IC packages to enable warpage control.

Example 13 may include the method of example 12 and/or any other example disclosed herein, for which the deposition of the epoxy material further comprises using a lamination, spray coating, slit coating, spin coating, or molding process.

Example 14 may include the method of example 12 and/or any other example disclosed herein, which further includes placing a removable film on the bottom surface of the support panel, for which the backside molding layer is deposited on the removable film.

Example 15 may include the method of example 14 and/or any other example disclosed herein, which further includes removing the removable film and the backside molding layer, removing the plurality of IC packages from the support panel, and re-using the support panel.

Example 16 may include the method of example 15 and/or any other example disclosed herein, for which the removable film comprises a low adhesion tape that is removed from the support panel using a peeling process, for which the backside molding layer is simultaneously removed with the removable film.

Example 17 may include the method of example 15 and/or any other example disclosed herein, for which removing the removable film comprises using a mechanical de-bonding process, for which the backside molding layer is simultaneously removed with the removable film.

Example 18 may include the method of example 15 and/or any other example disclosed herein, for which removing the removable film comprises using a thermal debonding process, for which the backside molding layer is simultaneously removed with the removable film.

Example 19 may include the method of example 15 and/or any other example disclosed herein, for which removing the removable film comprises using a chemical de-bonding process, for which the backside molding layer is simultaneously removed with the removable film.

Example 20 may include the method of example 15 and/or any other example disclosed herein, for which removing the removable film comprises using a laser debonding process, for which the backside molding layer is simultaneously removed with the removable film.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor carrier platform comprising:
   a support panel with a top surface and a bottom surface, wherein the top surface provides an active or working surface for integrated-circuit packages;
   a backside molding layer, wherein the backside molding layer is positioned on the bottom surface of the support panel and has a coefficient of thermal expansion that is selected based on a coefficient of thermal expansion for the integrated-circuit packages to enable warpage control; and
   a removable film positioned between the bottom surface of the support panel and the backside molding layer.

2. The semiconductor carrier platform of claim 1, wherein the backside molding layer further comprises an epoxy material.

3. The semiconductor carrier platform of claim 1, wherein the backside molding layer further comprises a molded material that is the same or similar to a mold material used in the integrated-circuit packages.

4. The semiconductor carrier platform of claim 1, wherein the support panel further comprises the backside molding layer being sized to be at least co-extensive with an active area of the support panel.

5. A method comprising:
   providing a support panel, wherein the support panel has a top surface and a bottom surface and the top surface provides an active area for assembly of integrated-circuit packages;
   placing a removable film on the bottom surface of the support panel; and
   depositing an epoxy material on the removable film to form a semiconductor carrier platform, wherein the epoxy material provides a backside molding layer for the semiconductor carrier platform that enables warpage control.

6. The method of claim 5, wherein the deposition of the epoxy material further comprises using a lamination, spray coating, slit coating, spin coating, or molding process.

7. The method of claim 5, further comprising providing the backside molding layer with a level working surface.

8. The method of claim 7, wherein the level working surface for the backside molding layer is provided by chemical-mechanical polishing.

9. The method of claim 5, wherein the backside molding layer has a thickness that is selected based on a thickness of the integrated-circuit packages.

10. The method of claim 5, wherein the backside molding layer enables warpage control by having a coefficient of thermal expansion that is selected based on a coefficient of thermal expansion for the integrated-circuit packages.

11. The method of claim 5, further comprising:
   removing the removable film and the backside molding layer;
   removing the integrated-circuit packages from the support panel; and
   re-using the support panel,
   wherein removing the removable film comprises using a mechanical debonding process, wherein the backside molding layer is simultaneously removed with the removable film.

12. A method comprising:
   providing a support panel, wherein the support panel has a top surface and a bottom surface;
   providing a plurality of integrated-circuit packages on an active area of the top surface of the support panel;
   depositing an epoxy material over the bottom surface, wherein the epoxy material provides a backside molding layer for the support panel; and
   performing semiconductor processing operations on the plurality of integrated-circuit packages, wherein the support panel and the backside molding layer provide a semiconductor carrier platform for integrated-circuit packages during the semiconductor processing operations, wherein the backside molding layer has a coefficient of thermal expansion that is selected based on a coefficient of thermal expansion for the integrated-circuit packages to enable warpage control.

13. The method of claim 12, wherein the deposition of the epoxy material further comprises using a lamination, spray coating, slit coating, spin coating, or molding process.

14. The method of claim 12, further comprising:

placing a removable film on the bottom surface of the support panel, wherein the backside molding layer is deposited on the removable film.

15. The method of claim 14, further comprising:

removing the removable film and the backside molding layer;

removing the plurality of integrated-circuit packages from the support panel; and re-using the support panel.

16. The method of claim 15, wherein the removable film comprises a low adhesion tape that is removed from the support panel using a peeling process, wherein the backside molding layer is simultaneously removed with the removable film.

17. The method of claim 15, wherein removing the removable film comprises using a mechanical debonding process, wherein the backside molding layer is simultaneously removed with the removable film.

18. The method of claim 15, wherein removing the removable film comprises using a thermal debonding process, wherein the backside molding layer is simultaneously removed with the removable film.

19. The method of claim 15, wherein removing the removable film comprises using a chemical debonding process, wherein the backside molding layer is simultaneously removed with the removable film.

20. The method of claim 15, wherein removing the removable film comprises using a laser debonding process, wherein the backside molding layer is simultaneously removed with the removable film.

* * * * *